United States Patent
Shin et al.

(10) Patent No.: US 11,392,729 B2
(45) Date of Patent: Jul. 19, 2022

(54) SYSTEM FOR MANAGING DESIGN BASES ON ROOM BASIS IN DESIGN BASES MANAGEMENT SYSTEM OF NUCLEAR POWER PLANT USING BUILDING INFORMATION MODEL AND METHOD THEREOF

(71) Applicant: KEPCO ENGINEERING & CONSTRUCTION COMPANY, INC., Gimcheon-si (KR)

(72) Inventors: Jae Seop Shin, Daejeon (KR); Young Dal Seo, Daejeon (KR); Hui Jeong Jang, Gimcheon-si (KR); Sang Je Lee, Seoul (KR)

(73) Assignee: KEPCO ENGINEERING & CONSTRUCTION COMPANY, INC., Gimcheon-si (KR)

( * ) Notice: Subject to any disclaimer, the term of this patent is extended or adjusted under 35 U.S.C. 154(b) by 235 days.

(21) Appl. No.: 16/899,616

(22) Filed: Jun. 12, 2020

(65) Prior Publication Data
US 2021/0012040 A1    Jan. 14, 2021

(30) Foreign Application Priority Data
Jul. 9, 2019  (KR) .................. 10-2019-0082827

(51) Int. Cl.
*G06F 30/20*  (2020.01)
*G06F 30/13*  (2020.01)

(52) U.S. Cl.
CPC .............. *G06F 30/13* (2020.01); *G06F 30/20* (2020.01)

(58) Field of Classification Search
CPC .................................. G06F 30/13; G06F 30/20
USPC ............................................................ 703/1
See application file for complete search history.

(56) References Cited

U.S. PATENT DOCUMENTS

| | | | |
|---|---|---|---|
| 10,607,741 B2 * | 3/2020 | Korhonen | G21D 3/06 |
| 2006/0200008 A1 * | 9/2006 | Moore-Ede | B60K 28/06 |
| | | | 128/920 |
| 2006/0263152 A1 * | 11/2006 | Conroy | E02D 1/00 |
| | | | 405/303 |

FOREIGN PATENT DOCUMENTS

| | | |
|---|---|---|
| KR | 10-1610192 | 4/2016 |
| KR | 2016-0051087 | 5/2016 |
| KR | 10-1736405 | 5/2017 |

OTHER PUBLICATIONS

Korean Office Action for KR-10-2019-0082827 dated Aug. 28, 2020.

* cited by examiner

*Primary Examiner* — Andre Pierre Louis
(74) *Attorney, Agent, or Firm* — Nixon Peabody LLP; Jeffrey L. Costellia (57) ABSTRACT

Provided is a method of managing design bases applied to a nuclear power plant in an integrated manner by using a building information model so that design bases attributes are precisely provided to a subsequent design by using a design bases information layer to ensure consistency between design drawings.

9 Claims, 7 Drawing Sheets

| DBIL No. | DBIL Attributes | Wall | Floor | Rooms | Door No. | Horizontal OPNG No. | Vertical OPNG No. |
|---|---|---|---|---|---|---|---|
| 1-01A | FR- | 1N1 | | 1-01 Main Control Room | | | |
| 1-01B | FR- | | 1S1 | 1-01 Main Control Room | | | |
| 1-01C | FR- | 1W2 | | 1-01 Main Control Room / 1-05 Plant Computer Room | HD-106 | | |
| 1-01D | FR- | 1W1 | | 1-01 Main Control Room | | | |
| 1-01E | FR- | | 2S1 | 1-01 Main Control Room / 2-17 Main Steam Enclosure Room A | | | |
| 1-01F | FR- | 1N2 | | 1-01 Main Control Room / 1-02 Spent Fuel Area | HD-107 | 1N2-1 | |
| 1-02A | -R- | 1N2 | | 1-01 Main Control Room / 1-02 Spent Fuel Area | HD-107 | 1N2-1 | |
| 1-02B | -R- | | 1S1 | 1-02 Spent Fuel Area | | | |
| 1-02C | -R- | 1W2 | | 1-02 Spent Fuel Area / 1-06 Switchgear Room | | 1W2-1 | |
| 1-02D | -R- | 1W1 | | 1-02 Spent Fuel Area | | | |
| 1-02E | -R- | | 2S1 | 1-02 Spent Fuel Area / 2-18 Filling Tank Room A | | | 393527 |
| 1-02F | -R- | 1N3 | | 1-02 Spent Fuel Area / 1-03 Central Alarm Station | HD-108 | 1N3-1 | |
| 1-03A | | 1N3 | | 1-02 Spent Fuel Area / 1-03 Central Alarm Station | HD-108 | 1N3-1 | |
| 1-03B | | | 1S1 | 1-03 Central Alarm Station | | | |
| 1-03C | | 1W2 | | 1-03 Central Alarm Station / 1-07 Station Battery Room A | | 1W2-2 | |
| 1-03D | | 1W1 | | 1-03 Central Alarm Station | | | |
| 1-03E | | | 2S1 | 1-03 Central Alarm Station / 2-19 Main Steam Enclosure Room B | | | 394043 |
| 1-03F | | 1N5 | | 1-03 Central Alarm Station / 1-04 Cable Spreading Room A | HD-109 | 1N5-1 | |
| 1-04A | | 1N5 | | 1-03 Central Alarm Station / 1-04 Cable Spreading Room A | HD-109 | 1N5-1 | |
| 1-04B | | | 1S1 | 1-04 Cable Spreading Room A | | | |
| 1-04C | F- | 1W2 | | 1-04 Cable Spreading Room A / 1-08 Disel Generator Room | HD-113 | | |
| 1-04D | F- | 1W1 | | 1-04 Cable Spreading Room A | | | |
| 1-04E | F- | | 2S1 | 1-04 Cable Spreading Room A / 2-20 Containment Enterance Area | | | |
| 1-04F | F- | 1N6 | | 1-04 Cable Spreading Room A | | | |
| 1-05A | F- | 1W3 | | 1-05 Plant Computer Room / 1-09 Pump Room | HD-104 | 1W3-1 | |
| 1-05B | F- | | 1S1 | 1-05 Plant Computer Room | | | |

610 620 630 640 650 660 670 680

SYSTEM FOR MANAGING DESIGN BASES ON ROOM BASIS IN DESIGN BASES MANAGEMENT SYSTEM OF NUCLEAR POWER PLANT USING BUILDING INFORMATION MODEL AND METHOD THEREOF

CROSS-REFERENCE TO RELATED APPLICATION

This application claims the benefit of Korean Patent Application No. 10-2019-0082827, filed on Jul. 7, 2019, in the Korean Intellectual Property Office, the disclosure of which is incorporated herein in its entirety by reference.

BACKGROUND

1. Field

One or more embodiments of the present disclosure relate to a method of managing design bases on a room basis in a design bases management system of a nuclear power plant.

2. Description of Related Art

Based on the domestic new nuclear power plant, APR1400 (Advanced Power Reactor 1400MW), the total number of drawings required for the construction of a nuclear power plant is about 65,000 sheets. Therefore, when designing large facilities, such as a nuclear power plant, it is necessary to precisely establish design requirements, such as laws, requirements, and the like, and design bases serving as a guideline are vital to ensure consistent design progress.

However, under the existing document-based design bases document (DBD) management system, design bases information applied to a nuclear power plant, which is a large-scale facility, is stored as a database based on documents and individually managed in various fields. Therefore, it is difficult to manage the design bases information in an integrated manner. In addition, it is difficult to clearly recognize the design bases information expressed in a two-dimensional document-based DBD and to precisely reflect the same in a subsequent design.

PRIOR ART DOCUMENTS

Patent Documents (Patent document 1) KR 2016-0051087

SUMMARY

According to embodiments of the present disclosure, design bases applied to a nuclear power plant are integrated and managed in a three-dimensional manner, based on a three-dimensional building information model (BIM), and design bases attributes are precisely provided to a subsequent design by using a design bases information layer (DBIL) to ensure consistency between design drawings, thus being possible to build a safe and reliable nuclear power plant design system.

Additional aspects will be set forth in part in the description which follows and, in part, will be apparent from the description, or may be learned by practice of the presented embodiments of the disclosure.

According to a preferred embodiment of the present disclosure, a method of managing design bases on a room basis in a design bases management system of a nuclear power plant includes: setting, on a room basis by a room-based design bases extraction unit, a design bases minimum management unit of a nuclear power plant and extracting design bases on the room basis to design the nuclear power plant; synchronizing the extracted room-based design bases and room-based information of a provider providing a BIM, and providing the updated room-based design bases to the room-based design bases extraction unit to synchronize the room-based design bases extraction unit with room-based design bases of the provider providing the BIM when room-based design bases provided by the BIM are updated; creating a DBIL on the room basis by using the BIM; and extracting design bases and design bases attributes based on the DBIL to visualize and store the same as a database.

According to a preferred embodiment of the present disclosure, design bases include physical protection design bases, fire protection design bases, ventilation protection design bases, internal flood protection design bases, radiation shield design bases, internal missile protection design bases, and external missile protection design bases.

According to a preferred embodiment of the present disclosure, the DBIL represents an intangible room-based layer and includes design bases attributes information provided to the room, and the design bases attributes information includes structure information including walls or floors and building element information including doors, a vertical opening unit or a horizontal opening unit.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings.

Figure 1:
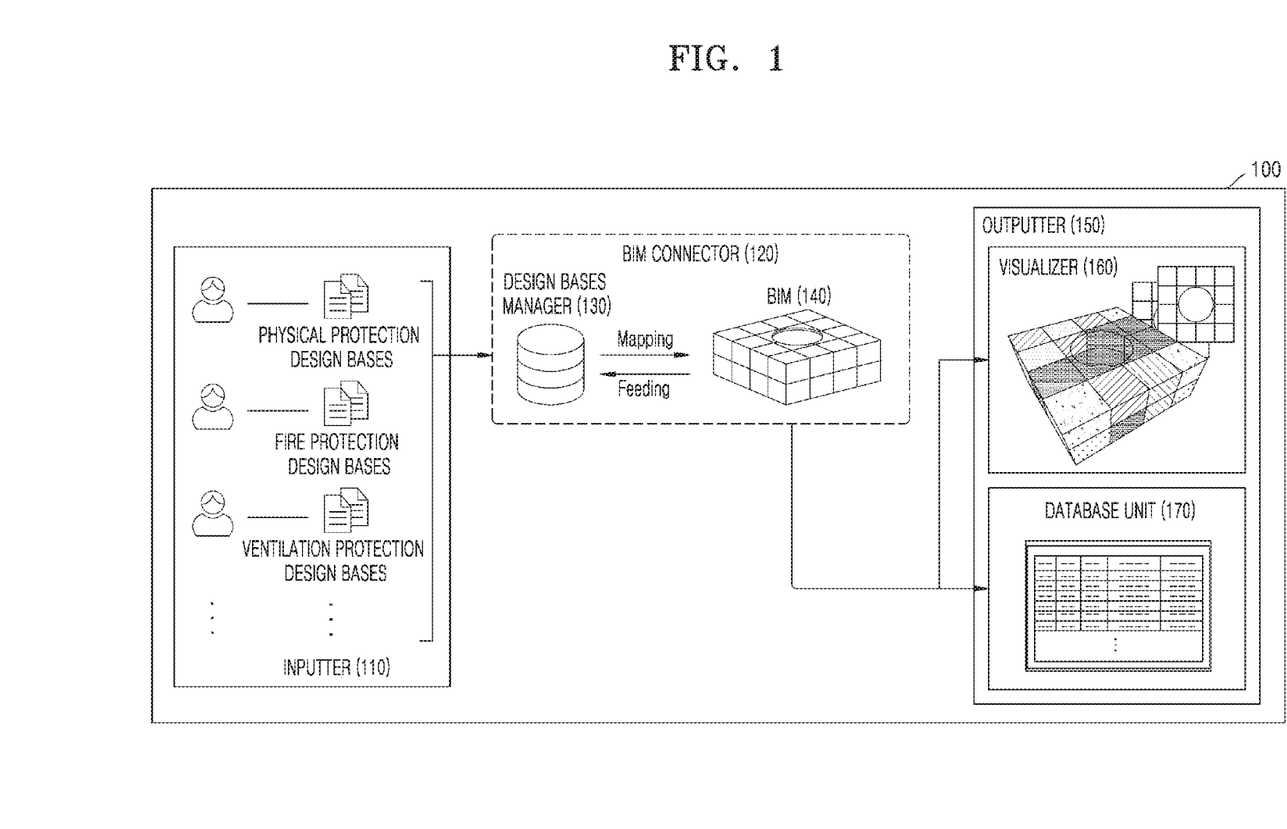
FIG. 1 is a diagram illustrating a configuration of a design bases management system of a nuclear power plant according to a preferred embodiment of the present disclosure.

FIG. 1 is a diagram illustrating a configuration of a design bases management system of a nuclear power plant according to a preferred embodiment of the present disclosure.

A nuclear power plant design bases management system 100 includes an inputter 110, a building information model (BIM) connector 120, and an out-putter 150. The BIM connector 120 connects a design bases manager 130 and a BIM 140. The out-putter 150 includes a visualizer 160 and a database unit 170.

The nuclear power plant design bases management system 100 establishes design bases on a room basis and automatically creates a design bases information layer (DBIL) corresponding to an intangible room-based layer by using a BIM when a specific room is entered. More specifically, when a specific room is entered, a DBIL including front, back, and side surfaces is created on a virtual layer, and a designer checks whether the created DBIL complies with the relevant nuclear power plant regulations.

Functions of each configuration are as follows.

The inputter 110 receives an analyzed result for each design bases drawn by a quantitative analysis by designers in various fields. The analyzed result includes a list of rooms corresponding to each design bases and a design bases attributes value of the room.

The BIM connector 120 connects design bases extracted by the design bases manager 130 on a room basis and a BIM and then automatically creates a DBIL, based on the BIM. For a detailed description of the design bases manager 130, refer to the configuration of a design bases manager 200 of FIG. 2, and for a description related to the DBIL, refer to the part related to FIG. 3.

Figure 4:
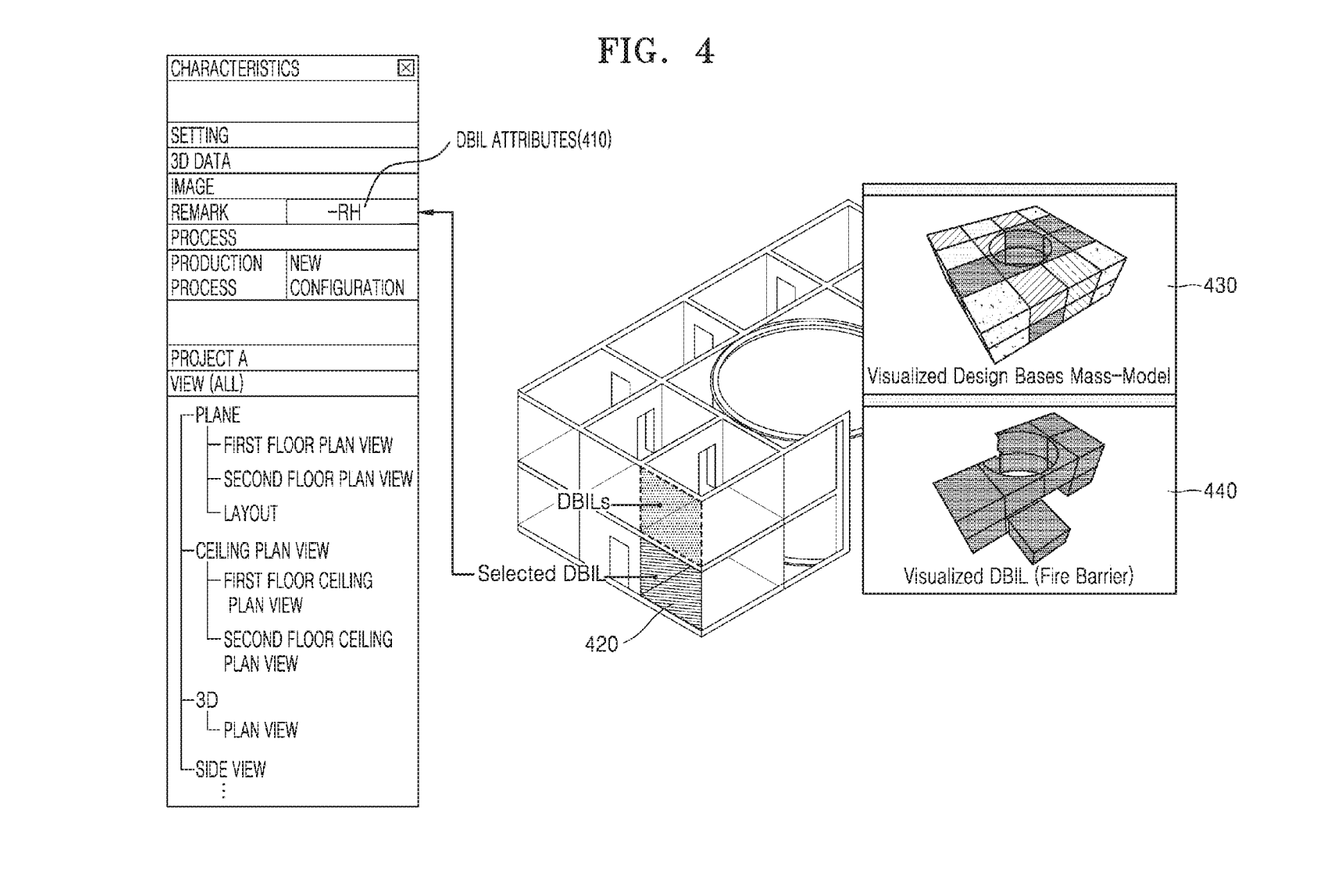
FIGS. 4 and 5 are diagrams illustrating an example of a result of a three-dimensional design bases management system of a nuclear power plant according to a preferred embodiment of the present disclosure.
Figure 5:
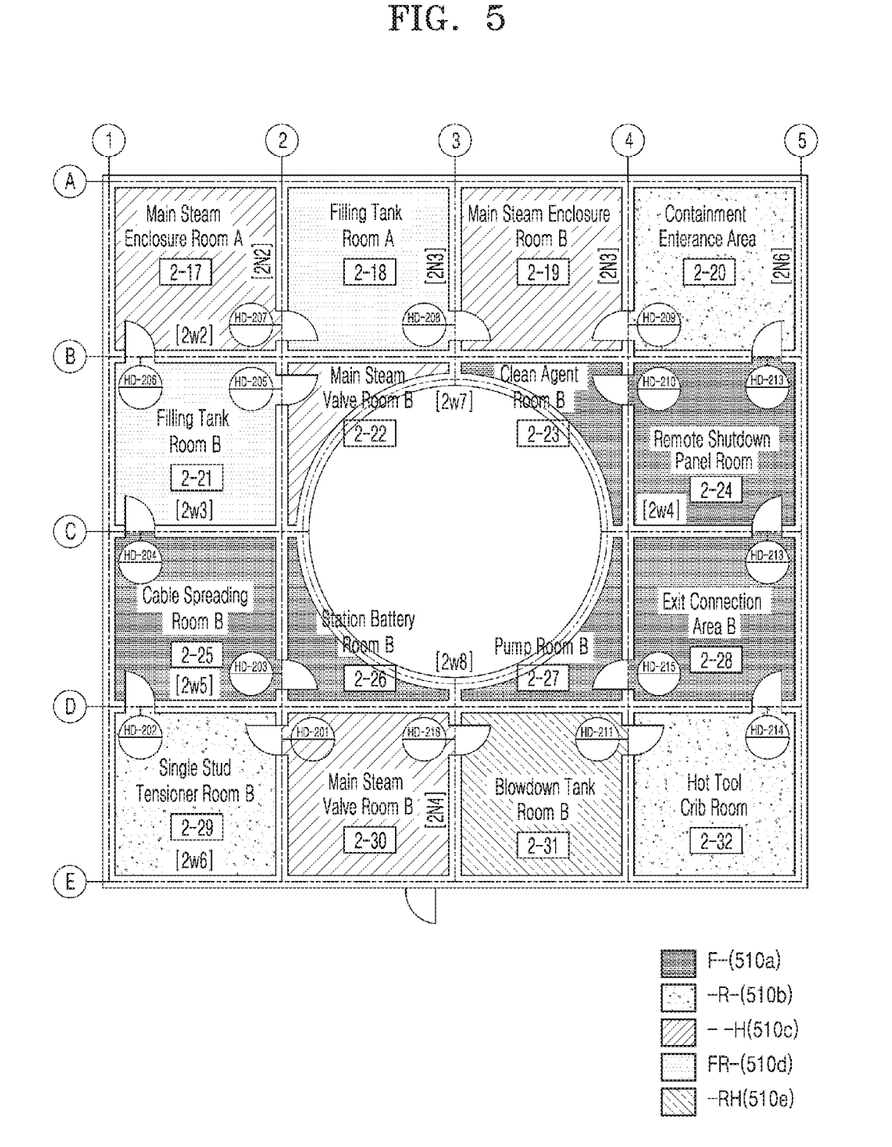
Figure 6:
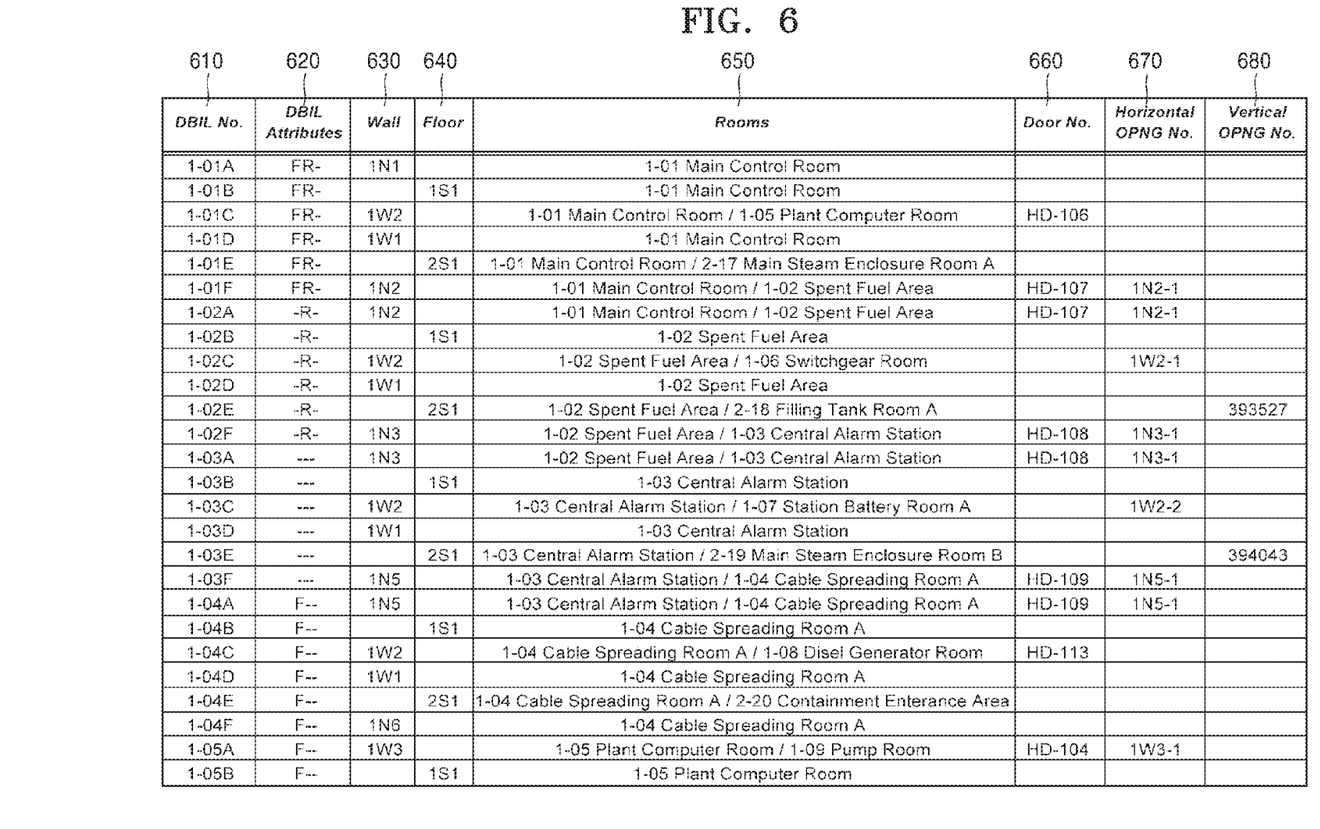
FIG. 6 is a diagram illustrating an example of a building element database for each of design bases, which is a result of a three-dimensional design bases management system of a nuclear power plant according to a preferred embodiment of the present disclosure.

Following that, the created DBIL, structure information, such as rooms, design bases attributes, walls, floors, and the like, and building element information, such as doors, vertical and horizontal opening units, and the like are extracted in association, stored and then output through the out-putter 150. As an example, when the above-described information is output through the visualizer 160, a result of the nuclear power plant design bases management system 100 may be displayed as shown in FIGS. 4 and 5. As another example, when the above-described information is output through the database unit 170, the result of the nuclear power plant design bases management system 100 may be stored as a database as shown in FIG. 6, and a subsequent design may be precisely provided with design bases attributes.

Figure 2:
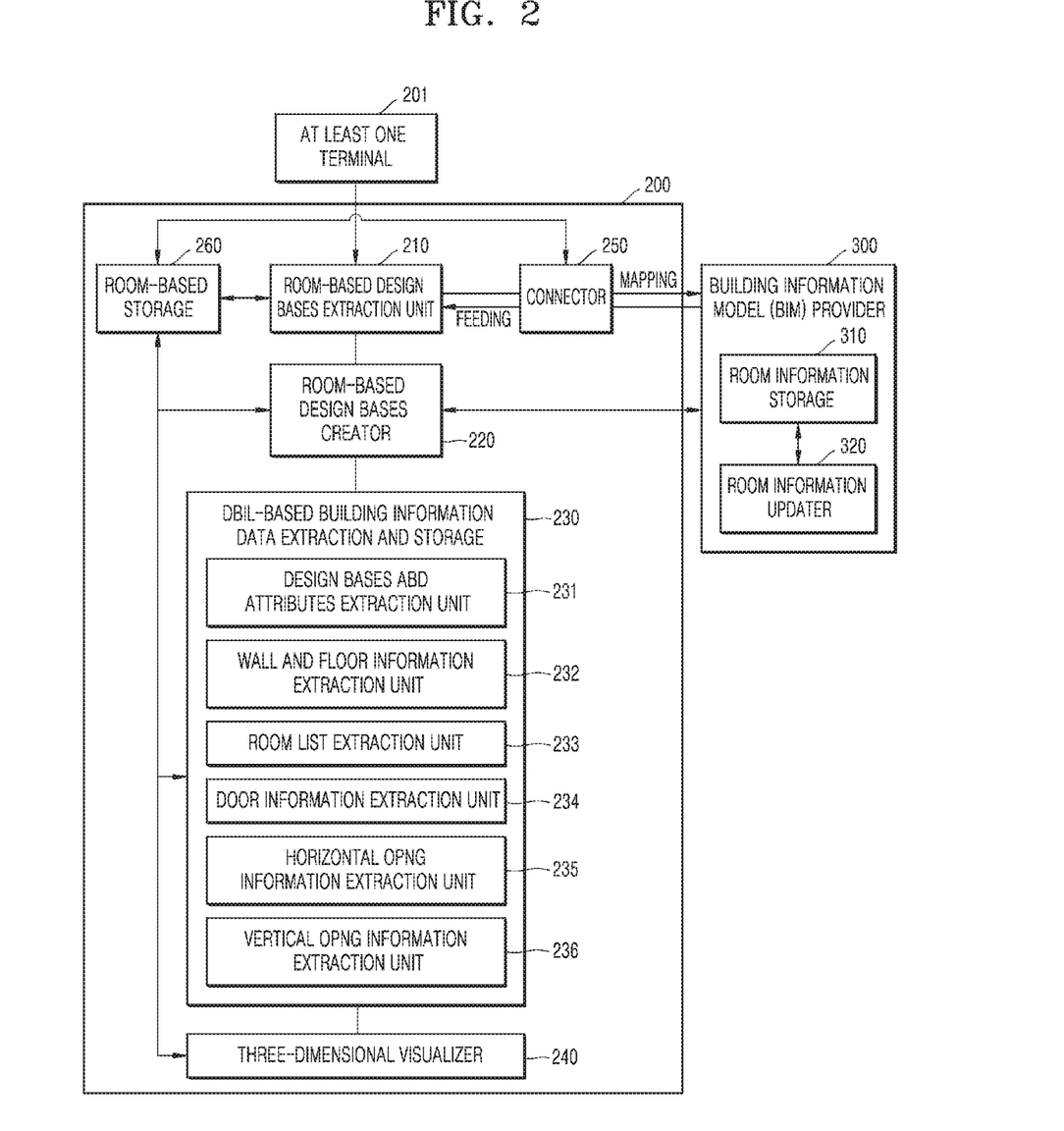
FIG. 2 is a block diagram illustrating a configuration of a design bases management system of a nuclear power plant according to another preferred embodiment of the present disclosure.

FIG. 2 is a block diagram illustrating a configuration of a design bases management system of a nuclear power plant according to a preferred embodiment of the present disclosure.

The nuclear power plant design bases management system includes the design bases manager 200, a BIM provider 300 providing a BIM. The BIM provider 300 includes a room information storage 310 and a room information updater 320. The BIM provider 300 provides information related to a BIM and also provides structure and building element information of a nuclear power plant information model.

According to a preferred embodiment of the present disclosure, the design bases manager 200 may be implemented in the form of a database, and the BIM provider 300 may be implemented in the form of a sever storing and managing a BIM algorithm.

According to a preferred embodiment of the present disclosure, the design bases manager 200 may be periodically and aperiodically connected to the BIM provider 300 through a connector 250 and share and manage room-based information and a change history of the room-based information. According to a preferred embodiment of the present disclosure, a room is referred to as a minimum management unit of a nuclear power plant.

The design bases manager 200 may synchronize design bases extracted by a room-based design bases extraction unit 210 with the BIM provider 300 through the connector 250. In that case, the design bases manager 200 may store the design bases extracted by the room-based design bases extraction unit 210 in a room-based storage 260 and synchronize the design bases stored in the room-based storage 260 with the room information storage 310 of the BIM provider 300.

In addition, when a change in room information occurs in the BIM provider 300, the design bases manager 200 may receive the changed information from the room information updater 320 through the connector 250 and store the changed design bases information in the room-based storage 260 to synchronize the changed room information.

According to a preferred embodiment of the present disclosure, the design bases manager 200 includes the room-based design bases extraction unit 210, a room-based DBIL creator 220, a DBIL-based building information data extraction and storage 230, a visualizer 240, the room-based storage 260, and the connector 250.

The room-based design bases extraction unit 210 receives an analyzed result for each design bases drawn by a quantitative analysis by designers in various fields, such as architects, nuclear power engineers, civil engineers, and the like from a terminal 201 used by the designers in various fields to extract design bases application objects and detailed design bases, on a room basis. The result of the quantitative analysis is a list of rooms corresponding to each design bases and design bases attributes values of the corresponding rooms.

For example, when an architect inputs design bases on fire protection into the room-based design bases extraction unit 210, a two-hour fire protection standard needs to be established in a stair room according to National Fire Protection Association 101 (NFPA 101, Life Safety Code), which is a related standard. Accordingly, a room name 'stair room' and a room attributes value 'two hours' are extracted from the room-based design bases extraction unit 210.

The room-based design bases extraction unit 210 extracts seven design bases that affect a physical shape of a nuclear power plant based on "US nuclear-related federal law" and "Rules for technical standards such as nuclear reactor facilities" of Korean law. There is US federal law 10CFR50 Appendix A, as an example of US nuclear-related federal law.

Seven design bases include physical protection design bases, fire protection design bases, ventilation protection design bases, internal flood protection design bases, radiation shield design bases, internal missile protection design bases, and external missile protection design bases. The internal missile protection design bases include high-energy piping judgment protection, and the external missile protection design bases include aircraft collision protection.

Each design bases are created and managed as a design bases document (DBD). In this specification, the DBD is used as a term including both design bases drawing and the DBD.

According to a preferred embodiment of the present disclosure, the room-based storage 260 stores design bases extracted by the room-based design bases extraction unit 210 and periodically connects the stored design bases to the BIM provider 300 and synchronize the same.

The room-based DBIL creator 220 creates a DBIL in each room, based on BIM information provided by the BIM. DBIL refers to a virtual layer including design bases attributes information provided to a room. DBIL is automatically created according to a room shape by using a BIM.

Figure 3:
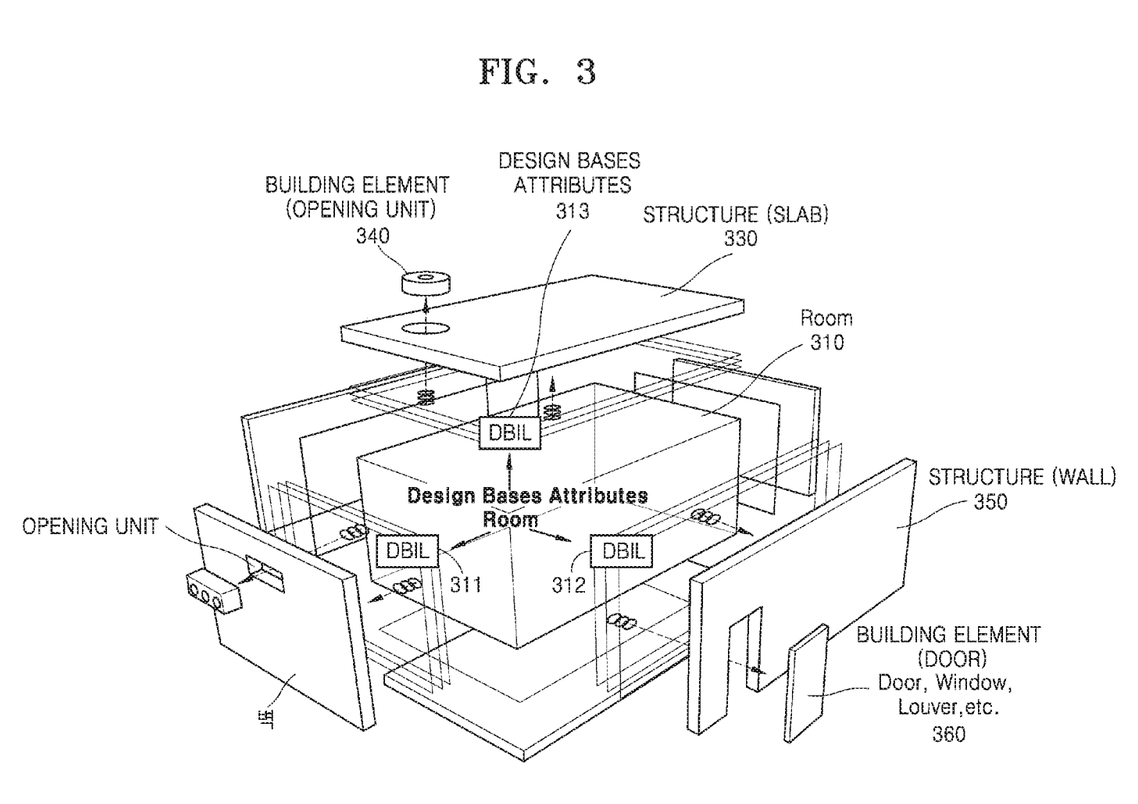
FIG. 3 is a diagram illustrating an example of using a design bases information layer (DBIL) according to a preferred embodiment of the present disclosure.

Referring to FIG. 3, when a specific room 310 is entered, DBILs 311, 312, and 313 around the specific room 310 are created based on design bases information provided to the specific room 310. Although three DBILs are shown in FIG. 3, up to six DBILs surrounding the specific room 310 may be created. For example, six DBILs may be created in a square planar room, and five DBILs may be created in a triangular planar room.

Based on the created DBILs 311, 312, and 313, design bases attributes 340, 360, and the like provided to rooms, doors, a vertical opening unit and a horizontal opening unit affecting design bases attributes 330, 350 and a DBIL provided to walls and floors are extracted. Dynamo's 'List, Filtered By Bool Mask' module, and the like may be used to extract design bases attributes. In this method, an entire DBIL list, an entire wall list, a floor list, a door list, the vertical opening unit, the horizontal opening unit, and the like are input to filter and extract elements having equality. A room affecting a DBIL refers to a list of rooms in contact with rooms that have created DBIL attributes. For example, a DBIL positioned on an outer wall is affected by only one room. However, a DBIL positioned between two rooms inside has a list of two or more related rooms.

The DBIL-based building information data extraction and storage 230 extracts information on walls, rooms, room lists, doors, vertical and horizontal opening units 232, 233, 232, 235, and 236 related to the DBIL created by each room.

The DBIL-based building information data extraction and storage 230 stores in association design bases attributes 620, wall number 630 to which related design bases are applied, slab number 640, number and name of affected rooms 650, door number 660, vertical opening unit number 670 and horizontal opening unit number 680, based on DBIL number 610 as shown in FIG. 6.

The visualizer 240 may display the above-described information in a three-dimensional block diagram or a two-dimensional diagram as shown in FIGS. 4 and 5, according to design bases attributes applied to each room.

FIG. 4 is a diagram illustrating an example of displaying a virtual two-layer plane in the form of a three-dimensional block diagram according to the design bases of a BIM according to a preferred embodiment of the present disclosure. In an embodiment of FIG. 4, as the room information stored in the room information storage 310 (refer to FIG. 2) of a BIM and the room information extracted by the room-based design bases extraction unit 210 (refer to FIG. 2) are synchronized with each other, a BIM room is automatically provided with design bases attributes. Accordingly, a three-dimensional model is automatically provided with a color.

The three-dimensional model includes design bases applied to each room 430 of the entire nuclear power plant facilities, which are color-coded and information on a three-dimensional block diagram 440 which extracts only rooms to which specific design bases are applied. When a DBIL 420 is selected from the three-dimensional model, the three-dimensional model may provide design bases attributes 410 of the selected DBIL. The designer may simultaneously check a three-dimensional building model, the DBIL, and the design bases attributes 410, thus preventing design errors due to misapplication of the design bases during detailed design and design changes.

FIG. 5 is a diagram illustrating an example of a plan view of a BIM divided according to colors 510a, 510b, 510c, 510d, and 510e of the design bases and displayed according to a preferred embodiment of the present disclosure. The result displayed by the visualizer 240 as shown in FIGS. 4 and 5 may be used for design, maintenance, and management of a nuclear power plant.

Figure 7:
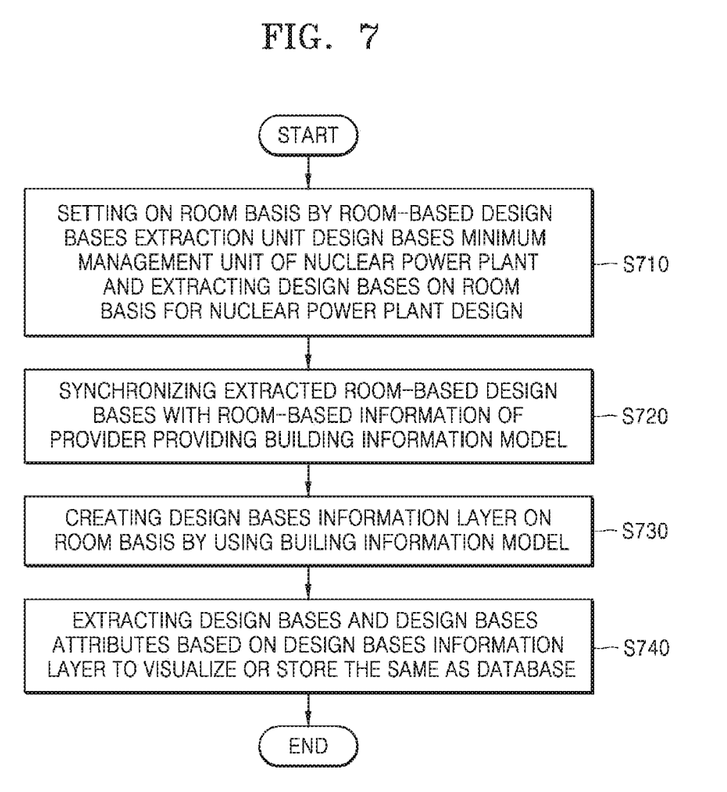
FIG. 7 is a flowchart of a method of performing design bases management in a design bases management system of a nuclear power plant according to a preferred embodiment of the present disclosure.

FIG. 7 is a flowchart of a method of managing design bases on a room basis in a design bases management system of a nuclear power plant according to a preferred embodiment of the present disclosure.

A room-based design bases extraction unit sets a design bases minimum management unit of the nuclear power plant, on a room basis and extracts design bases for design of the nuclear power plant, on a room basis in S710.

A connector synchronizes periodically or aperiodically room-based design bases extracted by a room-based design bases extraction unit with room-based information of a provider providing a BIM in S720.

Following that, a DBIL is created on a room basis by using a BIM, and based on the created DBIL, design bases and design bases attributes are extracted and then visualized or stored as a database to be output in S730.

Embodiments of the present disclosure may be implemented with a computer-readable code within a computer-readable recording medium. The computer-readable recording medium includes all kinds of recording devices in which data readable by a computer system is stored. Examples of the computer-readable recording medium include read only memory (ROM), random access memory (RAM), CD (compact disc)-ROM, magnetic tapes, floppy discs, optical data storage devices, and the like. In addition, the computer-readable recording medium is distributed over a network linked computer system, and a computer-readable code is stored and executed in a distributed manner therein.

A room is set as the design bases minimum management unit of a nuclear power plant. The design bases are able to be managed in an efficient and systematic manner in a series of processes of nuclear power plant design reflecting a design requirements analysis, design bases extraction, design bases, and the like by introducing a concept of a room-based DBIL.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of managing design bases on a room basis in a nuclear power plant design bases management system by using a building information model (BIM), the method comprising:

setting, on a room basis by a room-based design bases extraction unit, a design bases minimum management unit of a nuclear power plant and extracting design bases on the room basis for design of the nuclear power plant;

synchronizing the extracted room-based design bases and room-based information of a provider providing a BIM and providing the room-based design bases extraction unit with the updated room-based design bases to synchronize the room-based design bases extraction unit with room-based design bases of the provider providing the BIM when room-based design bases provided by the BIM are updated;

creating a design bases information layer (DBIL) on the room basis by using the BIM; and extracting design bases and design bases attributes based on the DBIL to visualize or store the same as a database.

2. The method of claim 1, wherein the design bases include physical protection design bases, fire protection design bases, ventilation protection design bases, internal flood protection design bases, radiation shield design bases, internal missile protection design bases, and external missile protection design bases.

3. The method of claim 1, wherein the DBIL represents an intangible room-based layer and includes design bases attributes provided to a room, and the design bases attributes include structure information including wall or floors and building element information including doors, a vertical opening unit, or a horizontal opening unit.

4. The method of claim 1, wherein the visualization represents a three-dimensional room space based on the BIM.

5. The method of claim 1, wherein the visualization represents a two-dimensional room space in different colors according to the design bases, based on the BIM.

6. A system for managing design bases of a nuclear power plant by using a building information model (BIM), the system comprising:

a room-based design bases extraction unit for setting, on a room basis, a design bases minimum management unit of a nuclear power plant, and extracting design bases on the room basis for design of the nuclear power plant;

a room-based storage for storing the extracted design bases, on the room basis;

a connector for periodically connecting room-based information provided by a provider providing a BIM to design bases extracted by the room-based design bases extraction unit;

a room-based design bases creator for creating a design bases information layer (DBIL), on the room basis, by using the BIM; and an out-putter for extracting design bases and design bases attributes, based on the DBIL to visualize and store the same as a database.

7. The system of claim 6, wherein the DBIL represents an intangible room-based layer and includes design bases attributes provided to a room, and the design bases attributes include structure information including walls or floors and building element information including doors, a vertical opening unit or a horizontal opening unit.

8. The system of claim 6, wherein the visualization represents a three-dimensional room space based on the BIM.

9. The system of claim 6, wherein the connector provides the room-based design bases extraction unit with the updated room-based design bases to synchronize the room-based design bases extraction unit with the room-based design bases of the provider providing the BIM when room-based design bases provided by the BIM are updated.

* * * * *